United States Patent
Chen et al.

(10) Patent No.: US 10,079,441 B2
(45) Date of Patent: Sep. 18, 2018

(54) FIXING STRUCTURE OF ELECTRONIC DEVICE

(71) Applicant: JIANGYIN SINBON ELECTRONICS CO., LTD., Jiangyin, Jiangsu (CN)

(72) Inventors: Jen-Shing Chen, Jiangsu (CN); Xue Feng Zhang, Jiangsu (CN); Jian Zhou, Jiangsu (CN)

(73) Assignee: JIANGYIN SINBON ELECTRONICS CO., LTD., Jiangyin (CN)

( * ) Notice: Subject to any disclaimer, the term of this patent is extended or adjusted under 35 U.S.C. 154(b) by 0 days.

(21) Appl. No.: 15/444,006

(22) Filed: Feb. 27, 2017

(65) Prior Publication Data

US 2018/0166805 A1 Jun. 14, 2018

(30) Foreign Application Priority Data

Dec. 8, 2016 (CN) ..................... 2016 2 1338899 U

(51) Int. Cl.
*H05K 7/00* (2006.01)
*H01R 12/70* (2011.01)
*H01R 12/73* (2011.01)

(52) U.S. Cl.
CPC ....... *H01R 12/7005* (2013.01); *H01R 12/737* (2013.01)

(58) Field of Classification Search
CPC .......................... H01R 13/6581; H05K 9/0058
See application file for complete search history.

(56) References Cited

U.S. PATENT DOCUMENTS

| | | | | |
|---|---|---|---|---|
| 5,545,924 A * | 8/1996 | Contolatis | ............... | H01L 23/66 257/724 |
| 5,867,069 A * | 2/1999 | Kiser | ................... | H03B 5/1847 331/117 D |
| 8,182,290 B2 * | 5/2012 | Fonteneau | ........... | H05K 9/0058 439/607.21 |
| 8,426,751 B2 * | 4/2013 | Lee | ...................... | H01R 13/506 174/520 |
| 8,747,159 B2 * | 6/2014 | Liu | ...................... | G02B 6/4261 439/607.2 |
| 9,788,468 B2 * | 10/2017 | Ding | ..................... | H05K 9/0058 |
| 2005/0208831 A1 * | 9/2005 | Lee | ...................... | H05K 9/0058 439/607.06 |
| 2016/0359284 A1 * | 12/2016 | Hsu | ........................ | H01R 27/02 |

* cited by examiner

*Primary Examiner* — Yuriy Semenenko
(74) *Attorney, Agent, or Firm* — Rabin & Berdo, P.C.

(57) ABSTRACT

A fixing structure of electronic components has a first substrate, at least one second substrate, at least one electronic component, and at least one fixing mechanism. Each second substrate has at least two first pins to electrically connect to the first substrate. Multiple second pins formed on a side surface of the electronic component are electrically connected to the second substrate. The at least one fixing mechanism covers the at least one electronic component and the at least one second substrate. A first mounting part and a second mounting part respectively extend downward from opposite sides of the at least one fixing mechanism for clamping the electronic component and the second substrate so that the at least one electronic component and the at least one second substrate are erectly mounted on the first substrate. Thus, more electronic components are allowed to be erectly mounted on the first substrate.

6 Claims, 4 Drawing Sheets

FIXING STRUCTURE OF ELECTRONIC DEVICE

BACKGROUND OF THE INVENTION

1. Field of the Invention

The present invention relates to a fixing structure, especially a fixing structure of an electronic device.

2. Description of the Prior Arts

With the reference to FIG. 4, an electronic module includes a substrate 91 and an electronic component 92. Multiple circuits, not shown in the figure, are arranged on the substrate 91. Multiple mounting holes 911 are formed through the substrate 91 and correspond to the positions of the circuits. The electronic component 92 has two parallel side surfaces 921, a top surface and a bottom. Multiple pins 922 are mounted on one side surface 921 of the electronic component 92. When the side surface 921 is attached on the substrate 91, the pins 922 on the side surface 921 are inserted into and engage in the mounting holes 911 to electrically connect with the circuits.

As the electronic component 92 is a HFE9 relay, the side surface 921 of the electronic component 92 is larger than the top surface or the bottom. Because the pins 922 are mounted on the side surface 921 of the electronic component 92 and the side surface 921 is attached on the substrate 91 when the pins 922 are electrically connected to the substrate 91, the side surface 921 occupies a lot of space on the substrate 91 and degrades the utilization rate of the space.

SUMMARY OF THE INVENTION

The present invention provides a fixing structure of an electronic device, wherein the electronic components of the electronic device are erectly or vertically mounted on a substrate to reduce the occupied area. Thus, the amount of the electronic components arranged on the substrate may be increased, thereby achieving higher space utilization rate.

The fixing structure of an electronic device comprises:

a first substrate, wherein multiple first connecting holes and mounting grooves are formed on the first substrate;

at least one second substrate, wherein each second substrate has multiple second connecting holes formed on the second substrate and at least two first pins formed on a bottom of the second substrate, and the at least two first pins are correspondingly engaged with the first connecting holes and electrically connected to the first substrate;

at least one electronic component, wherein each electronic component has a bottom, at least one side surface, and multiple second pins formed on the side surface, and the multiple second pins of each one of the at least one electronic component are correspondingly engaged with the second connecting holes of the at least one second substrate to electrically connect to the at least one second substrate; and at least one fixing mechanism, wherein each fixing mechanism has a top plate, a first mounting part and a second mounting part respectively extending downward from two opposite sides of the top plate, the at least one fixing mechanism covers the at least one electronic component and the at least one second substrate to mount the at least one electronic component and the at least one second substrate on the first substrate; the first mounting part and the second mounting part are correspondingly engaged with the mounting grooves of the first substrate.

In this invention, the second pins of the electronic component engage with the second connecting holes of the second substrate for electrically connecting to the second substrate. The bottom of the electronic component is mounted on the first substrate. The first pins of the second substrate engage with the first connecting holes of the first substrate for electrically connecting to the first substrate. The fixing mechanism covers and holds the electronic component and the second substrate and mounts the electronic component and the second substrate on the first substrate. The first mounting part and the second mounting part are engaged with the mounting grooves. The electronic components can be erectly mounted on the first substrate to achieve higher space utilization rate.

DETAILED DESCRIPTION OF THE INVENTION

An embodiment of a fixing structure of an electronic device according to the present invention is explained below.

Figure 1:
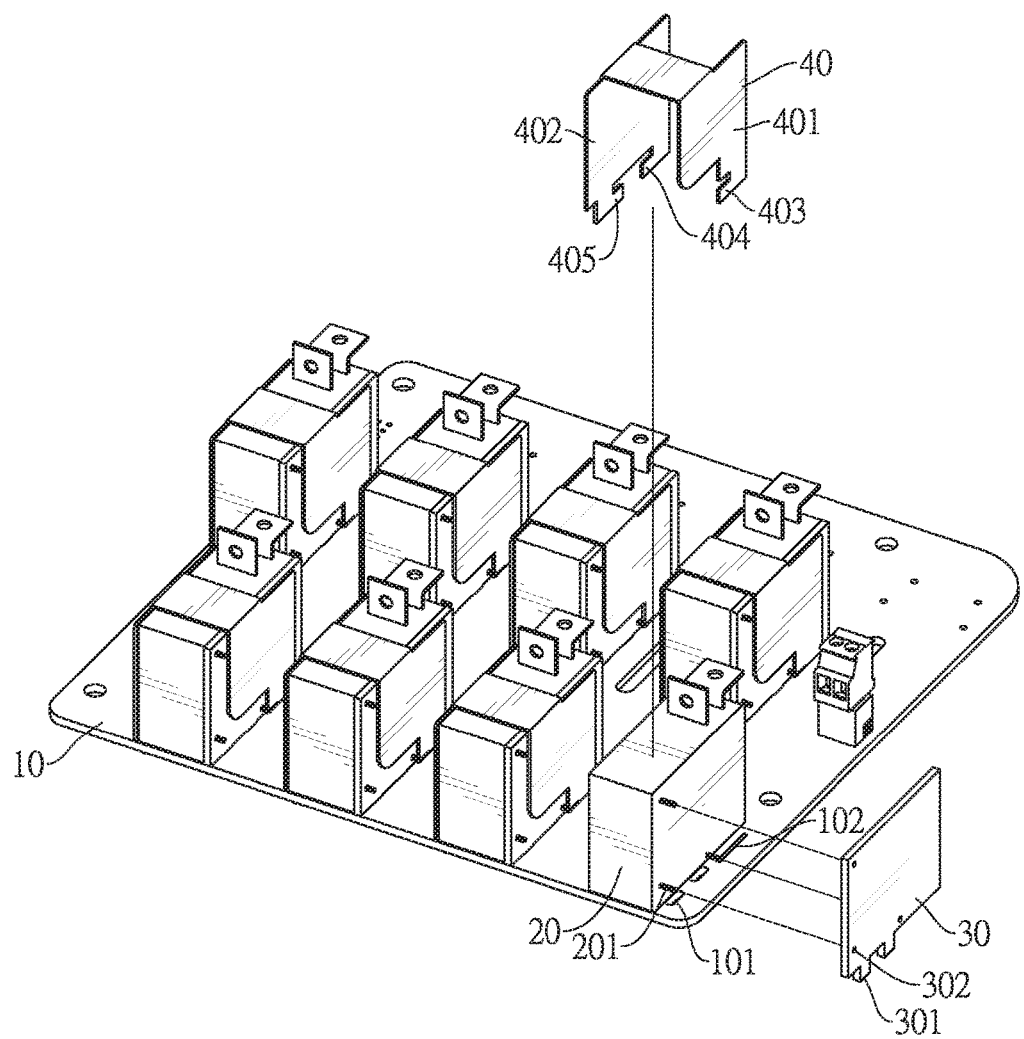
FIG. 1 is an exploded perspective view of an embodiment of the fixing structure of an electronic device of the present invention.
Figure 2:
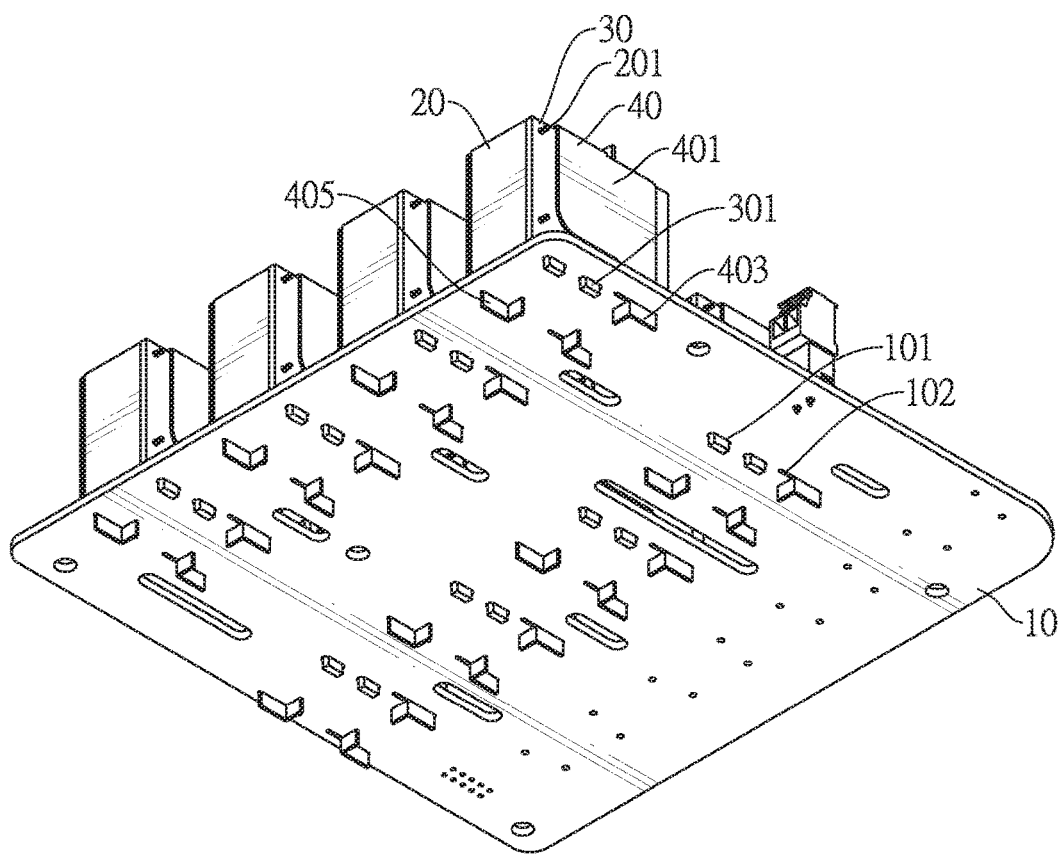
FIG. 2 is a bottom perspective view of an embodiment of the fixing structure of an electronic device of the present invention.

With reference to FIG. 1 and FIG. 2, the embodiment of the fixing structure of an electronic device comprises a first substrate 10, at least one electronic component 20, at least one second substrate 30, and at least one fixing mechanism 40. The at least one second substrate 30 is assembled on the at least one electronic component 20. The at least one second substrate 30 and the at least one electronic component 20 are mounted on the first substrate 10 via the at least one fixing mechanism 40.

Multiple first connecting holes 101 and mounting grooves 102 are formed through the first substrate 10. In this embodiment, multiple circuits are arranged on the first substrate 10 and electrically connect to the corresponding first connecting holes 101 and the corresponding mounting grooves 102.

Two first pins 301 are formed on a bottom of each second substrate 30 and correspondingly engage with the first connecting holes 101 in order to mount the second substrate 30 on the first substrate 10 and electrically connect to the first substrate 10. There are multiple second connecting holes 302 formed on each second substrate 30 for electrically connecting to the electronic component 20. In this embodiment, multiple circuits are arranged on each second substrate 30 and electrically connect to the corresponding second connecting holes 302.

Each electronic component 20 has a bottom and at least one side surface. The bottom of the electronic component 20 is mounted on the first substrate 10. Multiple second pins 201 are formed on the side surface of the electronic component 20, and correspondingly engage with the second connecting holes 302 so that the electronic component 20 is electrically connected to the first substrate 10 via the second substrate 30. In this embodiment, the electronic component 20 is a HFE9 relay.

Each fixing mechanism 40 has a top plate, a first mounting part 401 and a second mounting part 402 respectively extending downward from two opposite sides of the top plate. The top plate, the first mounting part 401 and the second mounting part 402 form an accommodating space for accommodating the electronic component 20 and the second substrate 30. The electronic component 20 and the second substrate 30 are erectly mounted on the first substrate 10 by the first mounting part 401 and the second mounting part 402. The first mounting part 401 and the second mounting part 402 correspondingly engage with the mounting grooves 102 of the first substrate 10 and clamp the electronic component 20 and the second substrate 30.

In this embodiment, a bottom of the first mounting part 401 extends downward to form a first blocking element 403. The first blocking element 403 is L-shaped and correspondingly engages the mounting groove 102. A bottom of the second mounting part 402 extends downward to form a second blocking element 404. The second blocking element 404 is L-shaped and correspondingly engages with the mounting groove 102. Thus the fixing mechanism 40 is firmly fixed on the first substrate 10 by the first blocking element 403 and the second blocking element 404.

In this embodiment, the second mounting part 402 further has a third blocking element 405 extending downward from the bottom of the second mounting part 402. The third blocking element 405 corresponds to the second blocking element 404, i.e. the third blocking element 405 aligns with the second blocking element 404. The third blocking element 405 engages with a corresponding one of the mounting grooves 102.

In this embodiment, each one of the first blocking element 403, the second blocking element 404 and the third blocking element 405 has a free terminal being bent and abutting against a bottom surface of the first substrate 10.

Figure 3:
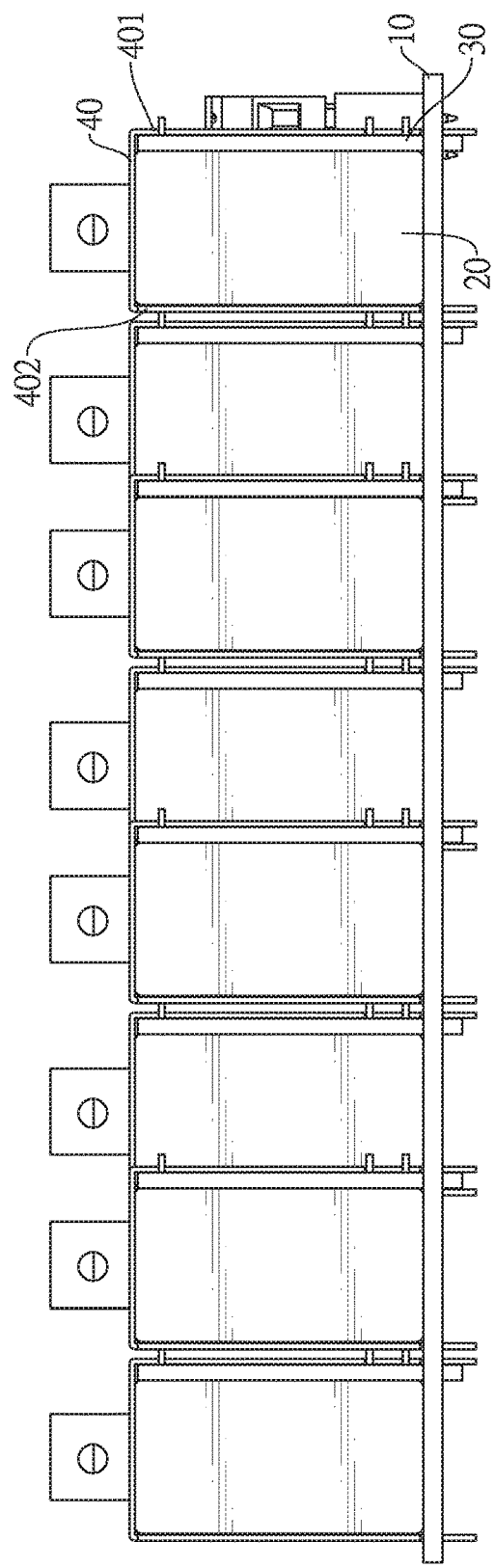
FIG. 3 is a side view of an embodiment of the fixing structure of an electronic device of the present invention.
Figure 4:
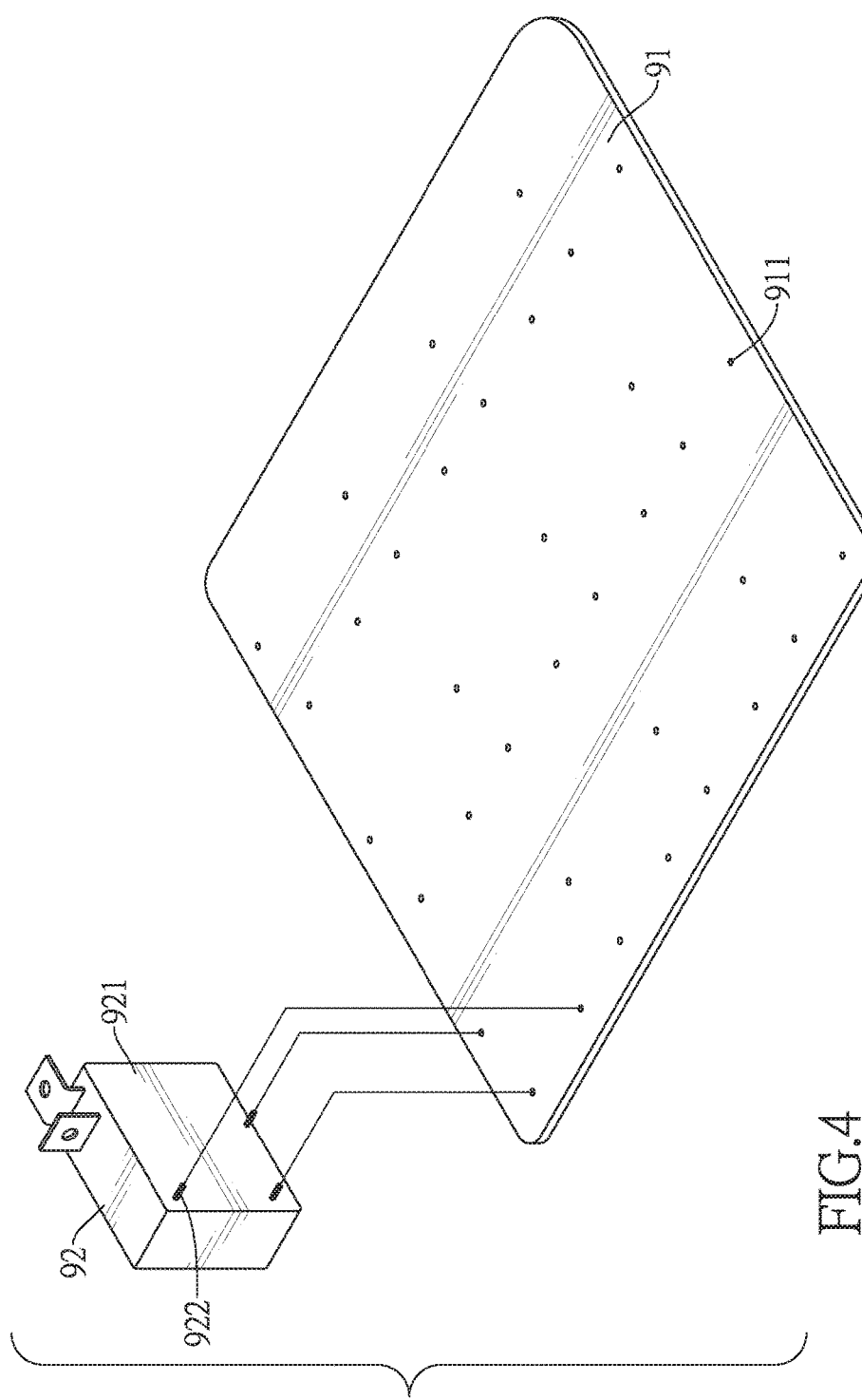
FIG. 4 is a perspective view of a conventional electronic module.

With reference to FIG. 3, the fixing mechanism 40 clamps the electronic component 20 and the second substrate 30 to erectly mount them on the first substrate 10. The first mounting part 401 and the second mounting part 402 engage the mounting groove 102 of the first substrate 10 in order to fix the electronic component 20 and the second substrate 30 on the first substrate 10. In addition, since the bottom of the electronic component 20 is smaller than the side surface of the electronic component 20, space occupation is reduced when the electronic component 20 is mounted on the first substrate 10 with the bottom of the electronic component 20 attached on the substrate 10. That means, more electronic components 20 can be arranged on the first substrate 10 even though the size of the first substrate 10 is small. Moreover, when the size of the first substrate 10 is big, further more electronic components 20 can be arranged on the first substrate 10. Thus in this invention, the first substrate 10 has much more design freedom and higher space utilization rate so that this invention is suitable for small space. When the first substrate 10 is small, the amount of the electronic components 20 arranged on the first substrate 10 will not be reduced. When the first substrate 10 is big, more electronic components 20 can be arranged on the first substrate 10.

Meanwhile, the electronic components 20 are electrically connected to the first substrate 10 via the second substrate 30. The electronic components 20 and the second substrates 30 are erectly mounted on the first substrate 10 by the first mounting part 401 and the second mounting part 402. This design makes each electronic component 20 occupy less area on the first substrate 10, thus more electronic components 20 can be arranged on the first substrate 10 to achieve higher space utilization rate.

Thus, preferred embodiments of the fixing structure have been disclosed. It should be apparent, however, to those skilled in the art that many more modifications besides those described are possible without departing from the invention concepts herein. The inventive subject matter, therefore, is not to be restricted in the spirit of the appended claims.

What is claimed is:

1. A fixing structure of an electronic device comprising:
   a first substrate, wherein multiple first connecting holes and mounting grooves are formed on the first substrate;
   at least one second substrate, wherein each second substrate has multiple second connecting holes formed on the second substrate and at least two first pins formed on a bottom of the second substrate, the at least two first pins are correspondingly engaged with the first connecting holes and electrically connected to the first substrate;
   at least one electronic component, wherein each electronic component has a bottom, at least one side surface and multiple second pins formed on each side surface, and the multiple second pins of each one of the at least one electronic component are correspondingly engaged with the second connecting holes of the at least one second substrate to electrically connect to the at least one second substrate; and
   at least one fixing mechanism, wherein each of the at least one fixing mechanism has a top plate, and a first mounting part and a second mounting part respectively extending downward from two opposite sides of the top plate extending; the at least one fixing mechanism covers and fixes the at least one electronic component and the at least one second substrate on the first substrate; the first mounting part and the second mounting part are correspondingly engaged with the mounting grooves of the first substrate.

2. The fixing structure of an electronic device as claimed in claim 1, wherein a first blocking element extends downward from a bottom of the first mounting part for engaging with a respective one of the mounting grooves.

3. The fixing structure of an electronic device as claimed in claim 2, wherein a second blocking element extends downward from a bottom of the second mounting part for correspondingly engaging with a respective one of the mounting grooves.

4. The fixing structure of an electronic device as claimed in claim 3, wherein a third blocking element further extends downward from the bottom of the second mounting part for correspondingly engaging with a respective one of the mounting grooves, and the third blocking element aligns with the second blocking element.

5. The fixing structure of an electronic device as claimed in claim 4, wherein each one of the first blocking element, the second blocking element and the third blocking element is L-shaped.

6. The fixing structure of an electronic device as claimed in claim 5, wherein each one of the first blocking element, the second blocking element and the third blocking element has a free terminal being bent and abutting against a bottom surface of the first substrate.

* * * * *